United States Patent [19]

Brock et al.

[11] Patent Number: 4,596,721
[45] Date of Patent: Jun. 24, 1986

[54] VACUUM EVAPORATING FILMS OF ALKALI METAL POLYPHOSPHIDE

[75] Inventors: David G. Brock, Mt. Kisco; John A. Baumann, Ossining, both of N.Y.

[73] Assignee: Stauffer Chemical Company, Westport, Conn.

[21] Appl. No.: 509,159

[22] Filed: Jun. 29, 1983

Related U.S. Application Data

[63] Continuation-in-part of Ser. No. 335,706, Dec. 30, 1981, abandoned, and Ser. No. 419,537, Sep. 17, 1982, and Ser. No. 442,208, Nov. 16, 1982, Pat. No. 4,508,931.

[51] Int. Cl.⁴ .................. B05D 5/12; C23C 16/00
[52] U.S. Cl. .................................. 427/82; 427/109; 427/166; 427/248.1; 427/255; 427/255.2
[58] Field of Search .............. 427/248.1, 255, 255.2, 427/82, 87, 85, 86, 109, 166, 164, 70, 314, 162

[56] References Cited

U.S. PATENT DOCUMENTS

| | | | |
|---|---|---|---|
| 4,145,314 | 3/1979 | Fung et al. | 502/213 |
| 4,150,065 | 4/1979 | Harris et al. | 260/683.2 |
| 4,195,891 | 4/1980 | Hellier | 252/512 |
| 4,359,406 | 11/1982 | Fung | 502/200 |
| 4,454,246 | 6/1984 | Fung | 502/213 |

FOREIGN PATENT DOCUMENTS 143705 9/1980 Fed. Rep. of Germany ...... 423/322

OTHER PUBLICATIONS

Kirk-Othmer, "Encyclopedia of Chemical Technology", Third Edition, vol. 4, John Wiley & Sons, p. 696.
"Comprehensive Inorganic Chemistry", Pergamon Press, pp. 1271-1278, 1973.
G. R. Hennig, "Some Experimental Observations in the Caesium-Graphite System", *Interstitial Compounds of Graphite in Progress in Inorganic Chemistry*, 1 1959.
Alfa Products "Alfa's 1981 Surplus Stock Sale—Graphimets-Graphite Intercalates", *Thiokol/Ventron Division Alfa Products*, pp. 2A-5A, 1981.
H. W. Melville and S. C. Gray, "The Polymerisation of Phosphorus", pp. 271-286; *Transactions of the Faraday Society*, 32, 271, (1936).
N. N. Greenwood & A. Earnshaw, "Graphite Intercalation Compounds", *Chemistry of the Elements*, Pergamon Press Ltd., pp. 313-314, 1984.

*Primary Examiner*—S. L. Childs
*Attorney, Agent, or Firm*—F. Eugene Davis, IV

[57] ABSTRACT

Fine quality catenated phosphorus thin films are produced in a high vacuum evaporator. Heated tungsten wire crackers are provided above the phosphorus boat and below the substrates. Amorphous pure phosphorus shiny red films have been deposited on glass, metallized glass and GaP and exhibit an optical edge at 2.0 eV. Films of $KP_x$ where x is equal to 15 or greater than 15 are produced by utilizing a second baffled boat source containing the potassium graphite intercalate, $KC_8$. Addition of a nickel evaporation source provides nickel-doped polyphosphide films.

28 Claims, 1 Drawing Figure

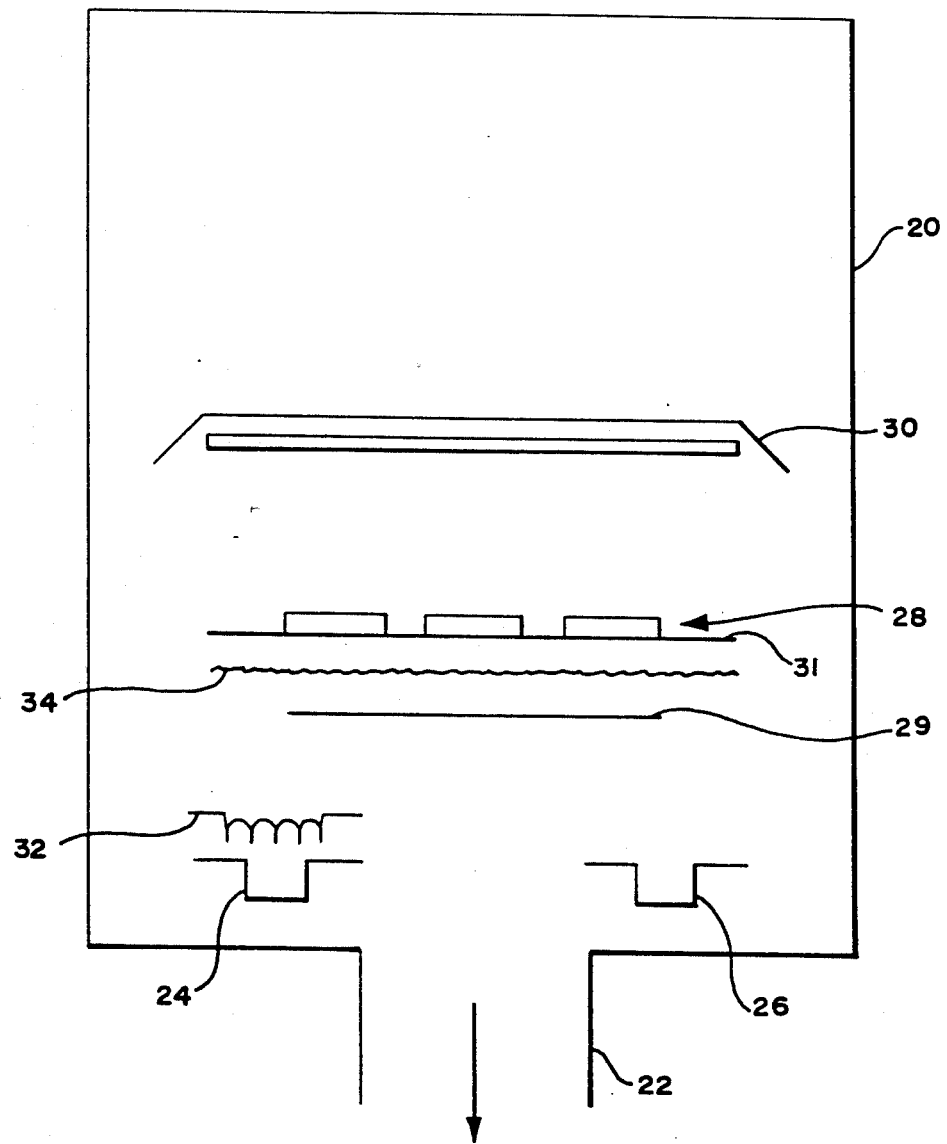

VACUUM EVAPORATING FILMS OF ALKALI METAL POLYPHOSPHIDE

This Application is a continuation-in-part of U.S. patent applications of the below-identified co-pending U.S. patent application, Ser. Nos. 335,706 filed Dec. 30, 1981, now abandoned; 419,537 filed Sept. 17, 1982; and 442,208 filed Nov. 16, 1982, U.S. Pat. No. 4,508,931.

RELATED APPLICATIONS

This application is related to the following co-pending applications, assigned to the same assignee as this application. These applications are incorporated herein by reference. U.S. patent application entitled CATENATED SEMICONDUCTOR MATERIALS OF PHOSPHORUS, METHODS AND APPARATUS FOR PREPARING AND DEVICES USING THEM, Ser. No. 335,706, filed Dec. 30, 1981, now abandoned; MONOCLINIC PHOSPHORUS FORMED FROM VAPOR IN THE PRESENCE OF AN ALKALI METAL, Ser. No. 419,537, filed Sept. 17, 1982 which is a continuation-in-part of Ser. No. 335,706 filed Dec. 30, 1982, now abandoned; CATENATED PHOSPHORUS MATERIALS, THEIR PREPARATION AND USE, AND SEMICONDUCTOR AND OTHER DEVICES EMPLOYING THEM, Ser. No. 442,208, filed Nov. 16, 1982, (now U.S. Pat. No. 4,508,931) which is a continuation-in-part of Ser. Nos. 335,706 and 419,537; and the applications of Rozalie Schachter, Marcello Viscogliosi, and Lewis A. Bunz, entitled SPUTTERED SEMICONDUCTING FILMS OF CATENATED PHOSPHORUS MATERIAL AND DEVICES FORMED THEREFROM Ser. No. 509,175, filed June 29, 1983; Christian G. Michel, Henry S. Marek, and John A. Baumann, entitled LIQUID PHASE GROWTH OF CRYSTALLINE POLYPHOSPHIDES Ser. No. 509,158, filed June 29, 1983; Diego Olego, David G. Brock, John A. Baumann, and William E. Spicer, entitled MIS DEVICES EMPLOYING ELEMENTAL PNICTIDE OR POLYPHOSPHIDE INSULATING LAYERS Ser. No. 509,210, filed June 29, 1983; and, Gary K. Miller, John A. Baumann, David G. Brock, and Mark A. Kuck, entitled GRAPHITE INTERCALATED ALKALI METAL VAPOR SOURCES Ser. No. 509,157, filed June 29, 1983.

TECHNICAL FIELD

This invention relates to vacuum evaporated films of catenated phosphorus material. More particularly, it relates to production of such films in a vacuum evaporator utilizing separately heated sources for the elements to be deposited. Superheated tungsten crackers are employed at the phosphorus source and below the substrates to ensure that only the $P_2$ species of phosphorus, not $P_4$, reaches the substrates. The products produced include a pure phosphorus semiconducting amorphous film having a band edge at 2.0 eV, insulating films for MIS devices on III-V semiconductors and catenated phosphorus semiconductors of the formula $MP_x$ where M is an alkali metal and x ranges from 15 to infinity. The invention also relates to the modification of such films by the incorporation of co-evaporated metal and to the manufacture of electronic semiconductor devices, electro-optical devices, thin films, optical films and coatings.

BACKGROUND ART

The above-identified, previously filed, co-pending applications disclose semiconductors formed of catenated phosphorus materials. It is highly desirable that uniform thin films of these materials be formed on a variety of substrates for use in electronic and electro-optical devices, as optical films, coatings and the like. It is further highly desirable than an easy and convenient method be found to reduce the intrinsic resistivity of these materials.

DISCLOSURE OF THE INVENTION

We have produced high quality thin films of polyphosphides, for example $KP_{15}$ and $KP_x$, where x is greater than 15, by a novel vacuum co-evaporation process. This process has produced fine quality films having irregularities no greater than approximately 20 angstroms. It offers the ability to easily change the stoichiometery of the depositing film at any point during a deposition.

The process also provides the ability to form pure phosphorus amorphous films which may be especially useful in MIS devices formed on III-V semiconductors.

The evaporations are performed in a Cooke high vacuum evaporator model CVE-301. This apparatus has a 12" stainless steel bell jar and a diffusion pump system with a base pressure of less than $10^{-6}$ torr. The system schematic is shown in the drawing. The bell jar 20 is pumped through outlet 22. Substrates 28, which have included glass, silicon, gallium phosphide and gallium arsenide are radiantly heated to temperatures between 25° C. and 325° C. and exposed to the upwardly directed vapor streams through openings in their support 31 (not shown). Baffled sources 24 and 26 obtained from R. D. Mathis are used for the phosphorus and the potassium respectively. They are resistively heated, boats made from molybdenum or tantalum. The potassium source may be elemental potassium or preferably a graphite intercalate such as $KC_8$, as disclosed in the co-pending application of Gary K. Miller, John A. Bauman, David G. Brock and Mark A. Kuck relating to Graphite Intercalated Alkali Metal Vapor Sources filed herewith, which application is incorporated herein by reference, the phosphorus is cracked from $P_4$ to $P_2$ by two high temperature tungsten filaments heated to greater than 1000° C. The first cracker 32 is located in the vapor stream emerging from the source 24, and the other 34 is located just below the substrates 28. The use of the cracker 34 at the substrates 28 is critical in that it prevents the formation of $P_4$ molecules which interfere with the formation of good quality films.

The phosphorus source which contains red phosphorus is resistively heated to 300°-700° C. and the potassium source is heated to 100°-400° C. by high current power supplies. By changing the source temperatures the evaporation rates can be controlled to produce KP compounds of different stoichiometries.

Further evaporation sources may be added to provide dopants, for example, an independently heated and controlled source of the $Al_2O_3$ crucible type heated by a tantalum wire basket may be utilized to evaporate nickel wire, heated to a temperature just below its melting point. This system has been used to provide nicked doped $KP_{15}$ films.

The single phosphorus boat has been utilized to provide amorphous red pure phosphorus films.

Films of phosphorus and polyphosphides have been provided on gallium phosphide, gallium arsenide, glass, and metallized glass substrates, metallized with nickel and titanium.

We believe our process employing the cracker 34 just below the substrates 28 may be utilized with other phosphorus sources than the heated baffle boat 24. For example, phosphine could be admitted to the system which would be reacted at the cracker 34 to provide the $P_2$ species employed. We believe this would be the best way to utilize phosphine as a phosphorus source, however phosphine could also be introduced without the use of the cracker 34 to react with the potassium at the substrates 28 and glow discharge could be employed to activate this reactive evaporation.

OBJECTS OF THE INVENTION

It is therefore an object of the invention to provide vacuum evaporated films of catenated phosphorus material.

Another object of the invention is to provide insulating films on III-V materials.

A further object of the invention is to provide pure phosphorus thin films by vacuum evaporation.

Still another object of the invention is to provide insulating films on III-V materials.

A still further object of the invention is to provide such films on a variety of substrates.

Still another object of the invention is to provide semiconductor and electro-optical devices, optical films, and coatings.

Other objects of the invention will in part be obvious and will in part appear elsewhere in this application.

The invention accordingly comprises several steps and the relation of one or more of such steps with respect to each of the others, the apparatus embodying the features of construction and arrangement of parts which are adapted to effect such steps, and the articles possessing the features, properties and relation of elements which are exemplified in this application. The scope of the invention is indicated in the claims.

BRIEF DESCRIPTION OF THE DRAWINGS

For a fuller understanding of the nature and objects of the invention reference should be made to the following detailed description taken in conjunction with the accompanying drawing in which the sole FIGURE is a schematic diagram of vacuum evaporation apparatus according to the invention.

BEST MODE FOR CARRYING OUT THE INVENTION

EXAMPLE 1

A Cooke high vacuum evaporator 20, Model CVE 301, was diffusion pumped through outlet 22 to a base pressure of less than $3 \times 10^{-5}$ torr. Two baffle boat sources for co-evaporation obtained from R. D. Mathis were used, one 24 containing powdered red phosphorus, the other 26 containing granular $KC_8$, a graphite intercalation compound. The sources were independently heated resistively and the temperature monitored by thermocouples. The substrates 28 were approximately 6" above the sources and shielded by a movable shutter 29. A quartz radiant heater 30 was used to bring the substrate temperature to 275°-285° C. The substrates were glass, metallized glass (metallized with Ni and Ti) and GaP.

Two high temperature tungsten "crackers" were used to convert the evaporating $P_4$ species to $P_2$. One is a coiled filament 32 directly above the exit of the P source; the other was a straight wire 34 1" below the substrates. Both wires are resistively heated to above 1000° C.

The phosphorus source 24 is heated until a constant pressure of $8-9 \times 10^{-4}$ torr is reached, as measured by a vacuum ionization gauge in the chamber 20. The $KC_8$ source 26 is heated to 275°-295° C. When both the $KC_8$ temperature and chamber pressure are stabilized, the shutter 29 is moved to allow deposition of the film. A three-hour deposition under these conditions will deposit approximately 1 micron of $KP_{15}$ as determined by x-ray fluorescence and Raman spectroscopy.

EXAMPLE 2

An identical experimental apparatus and procedure as was used in Example 1 with the addition of a third evaporation source. This, independently heated and controlled source is of the $Al_2O_3$ crucible type heated by a Ta wire basket. The evaporant material was Ni wire which was held at a temperature just below its melting point of 1453° C. A two-hour deposition yields 1.3 to 1.6 micron films of 0.2% Ni doped $KP_{15}$ films as determined by X-ray fluorescence, Raman spectroscopy and ESCA.

EXAMPLE 3

An identical experimental apparatus and procedure as Example 1 but with a substrate temperature of 275°-300° C., a $KC_8$ source temperature of 255°-275° C. and a chamber pressure of $1 \times 10^{-3}$ torr. The films resulting from a three-hour deposition are extremely smooth and shiny. The film thickness is 1.5-2.0 microns and the composition ranges from $KP_{40}$ to greater than $KP_{100}$. Thus stoichiometry can be controlled by the relative evaporation rates of the sources and thus by the temperatures of the sources.

EXAMPLE 4

An identical experimental apparatus and procedure as in Example 1 but without a $KC_8$ source. A two-hour deposition, at a pressure of $9 \times 10^{-4}$ torr, with a 285° C. substrate temperature yielded smooth, shiny red films 0.5 to 1.5 microns thick with an optical band edge at 2.0 eV. These films are amorphous by Raman spectroscopy. These films have been deposited on glass, metallized glass (Ni and Ti) and GaP. They have a high resistivity of greater than $10^{10}$ (ohm-cm) and a breakdown voltage in the order of $10^5$ volts per centimeter. They may therefore be used as the insulating layer in MIS devices formed on III-V semiconductors as disclosed in the application of Diego Olego, David G. Brock, John A. Baumann, and William E. Spicer, entitled MIS Devices Employing Elemental Pnictide Or Polyphosphide Insulating Layers, filed herewith. That application is incorporated herein by reference.

The graphite intercalation compounds used as a source of potassium in Examples 1 and 2 are disclosed in the copending application of Gary K. Miller, John A. Baumann, David G. Brock, and Mark A. Kuck, entitled Graphite Intercalated Alkali Metal Vapor Sources, filed herewith. Said application is incorporated herein by reference.

It will thus be seen that the objects set forth above, among those made apparent from the preceding description, are efficiently obtained and, since certain changes may be made in carrying out the above methods and in the articles and apparatus set forth without departing from the scope of the invention, it is intended that all matter contained in the above description or shown in the accompanying drawing, shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Particularly, it is to be understood that in the claims, ingredients and compounds recited in the singular are intended to include compatible mixtures of such ingredients wherever the sense permits.

Having described our invention what we claim as new and desire to secure by Letters Patent is:

1. The method of forming an evaporated film of catenated phosphorus material comprising depositing such a film onto a substrate having a smooth surface in the presence of a phosphorus cracker and a heated alkali metal intercalate source.

2. Vacuum evaporating a film of an alkali metal polyphosphide onto a substrate having a smooth surface from a heated alkali metal intercalate source and a phosphorus source.

3. Vacuum evaporating a film of an alkali metal polyphosphide onto a substrate having a smooth surface in the presence of a phosphorus cracker from a heated alkali metal intercalate source.

4. The method claimed in claim 1, 2 or 3, wherein such film is substantially pure phosphorus containing only a minor amount of alkali metal.

5. The method of forming an evaporated film of $MP_x$, where M is an alkali metal, and x ranges from 15 to infinity, inclusively, comprising depositing such a film onto a substrate in the presence of a phosphorus cracker.

6. The method of claim 5 wherein said film is $KP_{15}$.

7. The method claimed in claim 1, 2, 3, or 5, wherein said substrate is glass.

8. The method claimed in claim 1, 2, 3, or 5, wherein said substrate is metallized glass.

9. The method claimed in claim 1, 2, 3, or 5, wherein said substrate is a III-V semiconductor.

10. The method claimed in claim 9, wherein said substrate is gallium phosphide.

11. The method claimed in claim 9, wherein said substrate is gallium arsenide.

12. The method claimed in claim 7, wherein said film comprises $MP_x$ where M is an alkali metal and x is equal to or greater than 15.

13. The method claimed in claim 8, wherein said film comprises $MP_x$ where M is an alkali metal and x is equal to or greater than 15.

14. The method claimed in claim 9, wherein said film comprises $MP_x$ where M is an alkali metal and x is equal to or greater than 15.

15. The method claimed in claim 10, wherein said film comprises $MP_x$ where M is an alkali metal and x is equal to or greater than 15.

16. The method claimed in claim 11, wherein said film comprises $MP_x$ where M is an alkali metal and x is equal to or greater than 15.

17. The method claimed in claim 7, wherein said film is $KP_{15}$.

18. The method claimed in claim 8, wherein said film is $KP_{15}$.

19. The method claimed in claim 9, wherein said film is $KP_{15}$.

20. The method claimed in claim 10, wherein said film is $KP_{15}$.

21. The method claimed in claim 11, wherein said film is $KP_{15}$.

22. The method claimed in claim 1, 2, or 3, wherein said intercalate source is a graphite intercalate.

23. The method claimed in claim 1, 2, or 3, wherein said intercalate source is $KC_8$.

24. The method claimed in claim 1, 2, 3, or 5, wherein said phosphorus cracker is heated.

25. The method claimed in claim 24, wherein said cracker is a heated filament.

26. The method claimed in claim 25, wherein said cracker is located immediately below said substrate.

27. The method defined in claim 1, 2, or 3, wherein said film comprises $MP_x$ where M is an alkali metal and x is equal to or greater than 15.

28. The method defined in claim 27, wherein said film is $KP_{15}$.

* * * * *

UNITED STATES PATENT AND TRADEMARK OFFICE
CERTIFICATE OF CORRECTION

PATENT NO. : 4,596,721
DATED : June 24, 1986
INVENTOR(S) : David G. Brock, John A. Baumann It is certified that error appears in the above-identified patent and that said Letters Patent is hereby corrected as shown below:

Col. 1, line 24, "1982" should read -- 1981 --.

Col. 2, line 9, "than" should read -- that --.

Col. 2, line 50, after "other" insert -- cracker --.

Signed and Sealed this

Twenty-fourth Day of November, 1987

Attest:

DONALD J. QUIGG

*Attesting Officer*  *Commissioner of Patents and Trademarks*